United States Patent
Lee

(10) Patent No.: US 7,903,467 B2
(45) Date of Patent: Mar. 8, 2011

(54) PROGRAMMING METHOD OF MULTI-BIT FLASH MEMORY DEVICE FOR REDUCING PROGRAMMING ERROR

(75) Inventor: Seung-Jae Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 237 days.

(21) Appl. No.: 12/007,217

(22) Filed: Jan. 8, 2008

(65) Prior Publication Data
US 2008/0165579 A1 Jul. 10, 2008

(30) Foreign Application Priority Data
Jan. 10, 2007 (KR) .................. 10-2007-0002971

(51) Int. Cl.
*G11C 16/34* (2006.01)
(52) U.S. Cl. .................. 365/185.22; 365/185.12; 365/185.11; 365/185.03; 365/185.09; 365/185.17; 365/185.33
(58) Field of Classification Search ............ 365/185.33, 365/185.22, 185.12, 185.11, 185.03, 185.09, 365/185.17
See application file for complete search history.

(56) References Cited

U.S. PATENT DOCUMENTS

| | | | |
|---|---|---|---|
| 5,894,435 A | 4/1999 | Nobukata | |
| 5,923,587 A | 7/1999 | Choi | |
| 6,288,935 B1 | 9/2001 | Shibata et al. | |
| 6,529,405 B2 | 3/2003 | Chang | |
| 6,714,448 B2 | 3/2004 | Manea | |
| 6,937,520 B2 | 8/2005 | Ono et al. | |
| 7,035,144 B2 | 4/2006 | Kim et al. | |
| 7,054,199 B2 | 5/2006 | Lee et al. | |
| 7,082,056 B2 | 7/2006 | Chen et al. | |
| 7,286,412 B1 * | 10/2007 | Chen ..................... | 365/185.24 |
| 7,295,468 B2 | 11/2007 | Shibata | |
| 7,327,609 B2 * | 2/2008 | Kim et al. ............. | 365/185.22 |
| 7,336,532 B2 * | 2/2008 | Chen ..................... | 365/185.03 |
| 7,397,704 B2 * | 7/2008 | Sim ...................... | 365/185.22 |
| 7,426,139 B2 * | 9/2008 | Ho et al. ................ | 365/185.03 |

FOREIGN PATENT DOCUMENTS

| | | |
|---|---|---|
| JP | 10-011981 | 1/1998 |
| JP | 2005-149593 A | 6/2005 |
| JP | 2005-216466 | 8/2005 |
| KR | 10-2001-0070086 A | 7/2001 |
| KR | 10-2002-0057055 | 7/2002 |
| KR | 10-2005-0087264 A | 8/2005 |
| KR | 10-2006-0024149 A | 3/2006 |

* cited by examiner

*Primary Examiner* — Andrew Q Tran
(74) *Attorney, Agent, or Firm* — Lee & Morse, P.C.

(57) ABSTRACT

A method of programming a plurality of memory cells of a flash memory device by selectively changing a threshold voltage distribution thereof from a first distribution to a second distribution, the method includes selecting at least one of the memory cells to be programmed, and programming the at least one selected memory cell to a voltage higher than a verify voltage, wherein the verify voltage is one of threshold voltages included in the first distribution or is higher than the threshold voltages included in the first distribution.

30 Claims, 8 Drawing Sheets

PROGRAMMING METHOD OF MULTI-BIT FLASH MEMORY DEVICE FOR REDUCING PROGRAMMING ERROR

BACKGROUND OF THE INVENTION

1. Field of the Invention

Embodiments of the invention relate to a semiconductor memory device, and more particularly, to a programming method employable by a multi-bit flash memory device.

2. Description of the Related Art

Semiconductor memory devices are generally classified into volatile semiconductor memory devices and nonvolatile semiconductor memory devices. Volatile semiconductor memory devices have a relatively fast read/write speed, but lose stored data when external power supply is interrupted. Nonvolatile semiconductor memory devices retain stored data even without external power supply. Therefore, nonvolatile semiconductor memory devices are used to store data that must be retained regardless of power supply. Examples of the nonvolatile semiconductor memory devices include a mask read-only memory (MROM), a programmable read-only memory (PROM), an erasable programmable read-only memory (EPROM), and an electrically erasable programmable read-only memory (EEPROM).

In general, since erase and write operations are relatively difficult with the MROMs, PROMs, and EPROMs, common users may not be able to update memory data. Erase and write operations may be electrically implemented with EEPROMs. Thus, EEPROMS are generally more widely used in system programming or auxiliary memory devices, which require continuous updating. Flash EEPROMs generally have a higher degree of integration than other types of EEPROMs. Thus, flash EEPROMs may be advantageous for high-capacity auxiliary memory devices. More particularly, a NAND-type flash EEPROM (hereinafter, referred to as a NAND flash memory) may generally enable a higher degree of integration than other types flash EEPROMs.

When 1-bit data is stored in a memory cell, the memory cell has one of two threshold voltage distributions corresponding to data '1' and data '0'. On the other hand, when 2-bit data is stored in a memory cell, the memory cell is programmed to a threshold voltage included in one of four threshold voltage distributions. Likewise, when 3-bit data is stored in a memory cell, the memory cell is programmed to a threshold voltage included in one of eight threshold voltage distributions. Various technologies for storing 4-bit data in one memory cell are being developed.

In general, a memory cell storing multi-bit data has one of a plurality of threshold voltage states. Therefore, it is difficult to provide a sufficient read margin between threshold voltage states in a multi-bit flash memory device using general program schemes and general circuit technologies. A multi-bit flash memory cell may have $2^k$ threshold voltage states corresponding to k bits stored within the limited threshold voltage range. That is, a multi-bit flash memory cell may be programmed densely in order to include $2^k$ threshold voltage states corresponding to k bits stored within the limited threshold voltage range. Thus, an interval (i.e., a read margin) between threshold voltage states of the multi-bit flash memory cell must be reduced.

For example, for storing 4-bit data, a threshold voltage distribution of each program operation in a multi-bit memory cell may have 16 threshold voltage states. For programming of 4-bit data, data may be sequentially input into a memory cell on a 4-page basis. More particularly, e.g., after third page data is programmed, the memory cell may have one of eight threshold voltage distributions 0 to 7. The fourth page data may be programmed to threshold voltage distributions corresponding to bit values of the fourth page data through the threshold voltage distributions 0 to 7 resulting from the programming of the third page data. After programming of the third page data, if the fourth page data corresponds to logic '1', the memory cell may be set to be Program Inhibit. A threshold voltage of the memory cell set to be Program Inhibit may not change after the programming of the fourth page data. On the other hand, if the fourth page data is logic '0', a threshold voltage of the memory cell may be programmed to a state 8. In this way, when the fourth page data is logic '0', threshold voltages of memory cells, which belong respectively to the threshold voltage states 0 to 7 after programming third page data, respectively change into threshold voltage states 8 to 15 through a programming operation.

After the program operation, the memory cells programmed to the threshold voltage states 8 to 15 may be program-verified. Program-verify operations may be performed in the arrangement order of the threshold voltage states 8 to 15. For example, verify read operations may be sequentially performed to detect whether the memory cells are programmed to the states 10 to 15. The memory cells, determined to be Program Pass through the verify read operation for each state, may be set to be Program Inhibit. The memory cells, determined to be Program Fail through the verify read operation, may be set to be reprogrammed.

FIG. 1 illustrates a diagram of a problem of charge loss that may occur during a programming operation of a multi-bit memory cell.

FIG. 1 illustrates threshold voltage distributions 30 and 35 created by programming of third page data and threshold voltage distributions 40 and 60 created by programming of fourth page data. In a normal case, the threshold voltage distribution 55 should be created in the form of a threshold voltage distribution 50. However, a flash memory device may include a memory cell that has defects in an insulating layer between a channel and a floating gate. Also, the threshold voltage of a memory cell may be reduced due to the charge loss of the floating gate by degradation or hot temperature stress (HTS).

Thus, rather than the normal threshold voltage distribution 50, the abnormal threshold voltage distribution 55 may be created by the programming of the third page data. In particular, due to the charge loss, there may be a memory cell whose threshold voltage is reduced below a first verify voltage Vpre2 corresponding to a state 9. Such a memory cell has a threshold voltage included in a distribution 70. A memory cell whose third page data is programmed to the threshold voltage corresponding to the distribution 70 may have a 2-bit error after the programming of the fourth page data. That is, the memory cells corresponding to the distribution 70 include memory cells that should be programmed to data '0101' according to the programming of the fourth page data. However, during the program operation of the fourth page data, the memory cells included in the distribution 70 may be set to be Program Inhibit after a one-time program loop. That is, because the memory cells included in the distribution 70 have a threshold voltage between the first verify voltage Vpre2 and the second verify voltage Vfy2, they are determined to be Program Pass and are then set to be Program Inhibit. At this point, the threshold voltages of the memory cells set to be Program Inhibit are fixed in the distribution 70. Thus, the threshold voltages of the memory cells that must be programmed to data '0101' are within the threshold voltage range corresponding to the data '0011' (Vfy2≦Vth≦Vpre2). Thus, the memory cells included in the distribution 70 include memory cells that should be programmed to data '0101' but instead have a threshold voltage corresponding to data '0011', according to the programming of the fourth page data. Such memory cells have a 2-bit error as can be seen from the comparison of the data '0011' and the data '0101'.

FIG. 2 illustrates a diagram of a problem of over-programming that may occur after programming, e.g., fourth page data.

Referring to FIG. 2, the threshold voltage of memory cells forms threshold voltage distributions 30 and 50 according to the programming of the third page data. The distribution 30 (or state 1) corresponds to 3-bit data '011'. The distribution 50 (or state 2) corresponds to 3-bit data '101'. By the programming of the fourth page data, memory cells included in the distribution 30 have a threshold voltage of one of the distributions 30 and 40. By the programming of the fourth page data, normal memory cells included in the distribution 50 have a threshold voltage of one of the distributions 50 and 60. The threshold voltage distribution 40 resulting from the programming of the fourth page data may be created in the form of a threshold voltage distribution 45 by the over-programmed memory cells. The threshold voltage distribution 45 includes a first verify voltage Vpre2 for verifying the programming to the threshold voltage distribution 40, and a threshold voltage distribution 80 exceeding over a second verify voltage Vfy2. Memory cells corresponding to the distribution 80 are memory cells that must be programmed to data '0011'. However, the memory cells corresponding to the distribution 80 is not set to be Program Inhibit by the program verify operation of the fourth page data. Rather, the memory cells included in the distribution 80 are misinterpreted as memory cells included in the distribution 50, and thus, may be programmed to the threshold voltage distribution 60 corresponding to data '0101'.

As described with reference to FIGS. 1 and 2, a memory cell may have at least 2-bit error due to charge loss or over-programming after the program operation of the fourth page data. Such an error causes a large load on a memory device that performs a read operation (fractional read) using a relative interval from a reference value of the threshold voltage distribution (e.g., an average value of the distribution). Such an error, e.g., a 2-bit error, may cause a load on error correction in a read operation. Even an error smaller than the 2-bit error may cause a large load on a read operation that is performed based on soft decision, when the threshold voltage resulting from the program operation has a relatively large interval.

As described above, the memory cells in the multi-bit flash memory device should be controlled to have a small interval between threshold voltage distributions corresponding to the data to be stored. A step size of a program voltage may be reduced for the dense threshold voltage distribution, but a reduction in the step size greatly reduces a programming speed.

A technique(s) for solving the limitations due to problems such as, e.g., charge loss and over-programming in the multi-bit flash memory device with a dense threshold voltage distribution is/are required.

SUMMARY OF THE INVENTION

Embodiments of the invention are therefore directed to a semiconductor memory device, and more particularly, to a programming method employable by a multi-bit flash memory device, which substantially overcome one or more of the problems due to the limitations and disadvantages of the related art.

It is therefore a feature of an embodiment of the present invention to provide programming methods employable by a multi-bit flash memory device, which may reduce a program error that may be generated due to charge loss and over-programming.

At least one of the above and other features and advantages of the present invention may be realized by providing a method of programming a plurality of memory cells of a flash memory device by selectively changing a threshold voltage distribution thereof from a first distribution to a second distribution, the method including selecting at least one of the memory cells to be programmed, and programming the at least one selected memory cell to a voltage higher than a verify voltage, wherein the verify voltage is one of threshold voltages included in the first distribution or is higher than the threshold voltages included in the first distribution.

The verify voltage may be one of the threshold voltages included in the first distribution or a maximum voltage of the first distribution. An interval between the first distribution and the second distribution may be less than an interval between the second distribution and a third distribution defined during programming of a prior page data, and the first distribution may correspond to a first state and the third distribution corresponds to a second state directly following the first state during programming of the prior page data. The verify voltage may be a second verify voltage and a first voltage difference between the second verify voltage and a maximum voltage of the first distribution may be less than a second voltage difference between a maximum voltage of the second distribution and a respective first verify voltage, the first verify voltage may correspond to a voltage between voltages of the first distribution and voltages of a third distribution defined during programming of a prior page data, and the first distribution may correspond to a first state and the third distribution corresponds to a second state directly following the first state during programming of the prior page data.

At least 2 or more multi-bit data may be stored in one memory cell of the flash memory device. The second distribution may be created by programming of page data among the multi-bit data. The second distribution may be created by programming of most significant bit (MSB) page data among the multi-bit data. The flash memory device may further include memory cells that are programmed from a third distribution to a fourth distribution higher than the second distribution during a period when the at least one memory cell is programmed to change the threshold voltage distribution thereof from the first distribution to the second distribution.

An interval between the first distribution and the second distribution may be different from an interval between the second distribution and the third distribution. An interval between the first distribution and the second distribution may be smaller than the interval between the second distribution and the third distribution. The verify voltage may be set such that the interval between the first distribution and the second distribution is different from the interval between the second distribution and the third distribution.

At least one of the above and other features and advantages of the present invention may be separately realized by providing a method of programming a multi-bit flash memory device including a memory cell having threshold voltage included in one of a plurality of voltage distribution states, the method including programming the memory cell such that the threshold voltage thereof changes from an initial state, and verifying whether the threshold voltage has been programmed to a voltage higher than a verify voltage corresponding to a target state, wherein the verify voltage is one of threshold voltages included in the initial state or is higher than the threshold voltages included in the initial state.

The voltage intervals between the voltage distribution states may be set to be different from each other. The target state may be a threshold voltage distribution that is created by programming of one bit of multi-bit data stored in the memory cell. The target state may be created by programming a most significant bit (MSB) page data among the multi-bit data. The initial state may be created by programming a least significant bit (LSB) page data among the multi-bit data. Verifying whether the threshold voltage has been programmed to a voltage higher than a verify voltage corresponding to a target state may include performing a first verify operation for verifying whether the threshold voltage of the memory cell has been included in the initial state or the target state, and performing a second verify operation for verifying whether the threshold voltage has been programmed to a voltage higher than the verify voltage.

Performing a first verify operation may include providing a preliminary verify voltage to a word line of the memory cell. The preliminary verify voltage may be higher than a maximum voltage of a threshold voltage distribution corresponding to the target state.

At least one of the above and other features and advantages of the present invention may be separately realized by providing a flash memory device, including a plurality of memory cells having a threshold voltage corresponding to one of a plurality of states corresponding to multi-bit data, a page buffer block coupled to bit lines of the memory cells and configured to perform a read/program operation, a high voltage generator configured to provide a program voltage or a program verify voltage to a word line of selected memory cells, and a controller controlling the high voltage generator or the page buffer block in order to verify whether a threshold voltage of the selected memory cells has been programmed from a first state to a second state among the plurality of states, during a program verify operation on one unit of the multi-bit data, wherein the program verify voltage is one of threshold voltages included in the first state or is higher than the threshold voltages included in the first state.

The program controller may control the high voltage generator or the page buffer block such that some of the plurality of memory cells are programmed from a third distribution to a fourth distribution higher than the second distribution, during a period while the selected memory cells are programmed such that the threshold voltage changes from the first distribution to the second distribution.

An interval between the first distribution and the second distribution may be different from an interval between the second distribution and the third distribution. The interval between the first distribution and the second distribution may be smaller than the interval between the second distribution and the third distribution.

The program verify voltage may be set such that an interval between the first distribution and the second distribution is different from an interval between the second distribution and the third distribution. The program verify voltage may include a first verify voltage and a second verify voltage for detecting whether the selected memory cells has been programmed to the second state.

The multi-bit data may have a size of 2 or more bits. The one unit may be a page unit set in the flash memory device. The bits of the multi-bit data may be designated by a page address and are programmed on a page basis. The one unit is the most significant bit (MSB) page data among the multi-bit data.

The threshold voltage corresponding to the second state may be a threshold voltage that is programmed when a most significant bit (MSB) page data is logic '0'. The one unit may be a data unit that is programmed by a Y-address of the flash memory device. The plurality of memory cells may be NAND-type flash memory cells. The plurality of memory cells may be NOR-type flash memory cells.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0002971, filed on Jan. 10, 2007, in the Korean Intellectual Property Office, and entitled: "Program Method of Multi-Bit Flash Memory Device for Reducing Program Error," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Below, a NAND flash memory device is used as an example for illustrating characteristics and functions of the present invention. Embodiments of the invention are not, however, limited thereto. Those of ordinary skill in the art appreciate that the detailed description may be amended or modified according to viewpoints and applications, not being out of the scope, technical idea and other objects of the present invention. Throughout the specification, the terms 'write' and 'program' have the same meaning.

Figure 3:
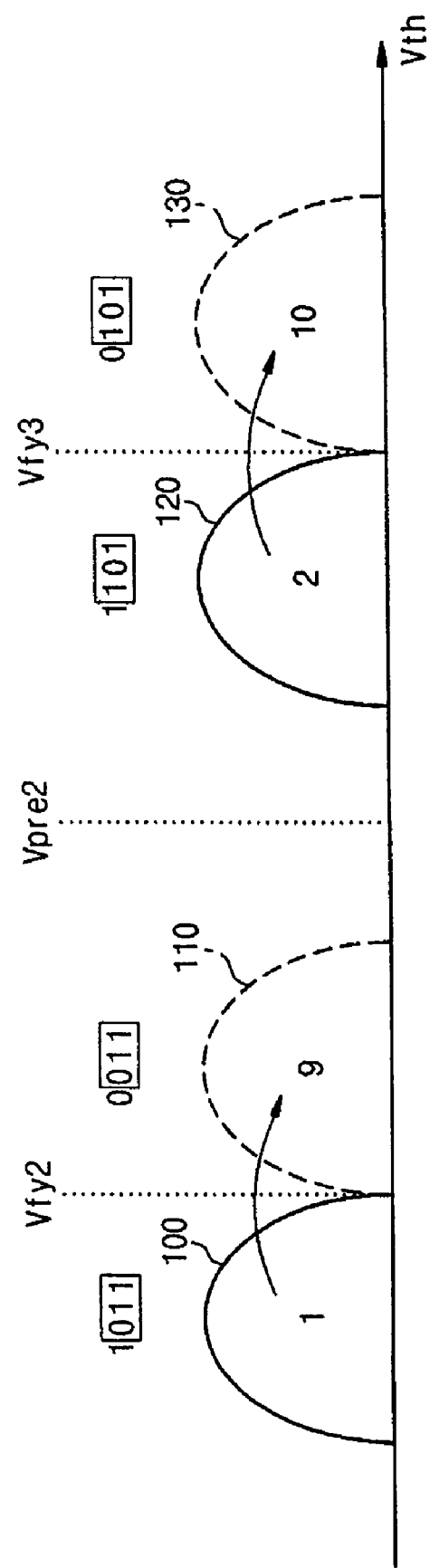
FIG. 3 illustrates a diagram of distributions of verify voltages and threshold voltages according to an exemplary embodiment of the present invention.

FIG. 3 illustrates a diagram of distributions of verify voltages and threshold voltages according to an embodiment of the present invention.

Referring to FIG. 3, in some embodiments, threshold voltage distributions resulting from programming of fourth page data may be respectively adjacent to threshold voltage distributions resulting from programming of third page data. The respective threshold voltage distributions 100, 120 may be set by setting second verify voltages Vfy2 and Vfy3. The second verify voltages Vfy2 and Vfy3 may respectively equal to or greater than a maximum voltage included in the respective threshold voltage distribution 100, 120 and equal to or less than a minimum voltage of the respective voltage distributions 110, 130. When, as illustrated in FIG. 3, the threshold voltage distributions resulting from programming of fourth page data are immediately adjacent to threshold voltage distributions resulting from programming of third page data, the second verify voltages Vfy2 and Vfy3 will be equal to the maximum voltage of the respective voltage distributions 100, 120, which, in turn, is equal to the minimum voltage of the respective voltage distributions 110, 130. T The second verify voltages Vfy2 and Vfy3 may be set respectively to maximum voltages of the threshold voltage distributions 100 and 120. The threshold voltage distributions after programming (hereinafter, referred to as 'post-program threshold voltage distributions') may be respectively adjacent to the threshold voltage distributions before programming (hereinafter, referred to as 'pre-program threshold voltage distributions') of the respective page data, e.g., the fourth page data. This will be described in more detail below.

The threshold voltage distribution 100 resulting from the programming of the third page data may result in the threshold voltage distribution 100 or the threshold voltage distribution 110 by the programming of the fourth page data. If the fourth page data is logic '1', the memory cell may be set to have a threshold voltage corresponding to data 1011. A memory cell with the fourth page data programmed to logic '1' may be set to be Program Inhibit and the threshold voltage of the memory cell may be included in the threshold voltage distribution 100. On the other hand, if the fourth page data is logic 0, the memory cell may be programmed to have a threshold voltage corresponding to data 0011 and the threshold voltage of the memory cell may be programmed to be included in the threshold voltage distribution 110.

By programming the fourth page data, among the memory cells included in the threshold voltage distribution 120, the memory cells with the fourth page data of logic 0 may be programmed to a threshold voltage corresponding to data 0101. That is, by programming the fourth page data, some of the memory cells included in the threshold voltage distribution 120 may have a threshold voltage included in the threshold voltage distribution 130, and others of the memory cells included in the threshold voltage 120 may retain the threshold voltage included in the threshold voltage distribution 120.

In particular, the threshold voltage distributions 110 and 130 that may result from programming of the fourth page data may be respectively adjacent to the threshold voltage distributions 100 and 120 resulting from programming the third page data. Pairs of the adjacent threshold voltage distributions 100 and 110, 120 and 130 may be created by programming of the fourth page data, and each pair may have an upper threshold voltage distribution 110, 130 and a lower threshold voltage distribution 100, 120. If the fourth page data is logic '1', the respective memory cells may be programmed to the respective lower threshold voltage distribution 100 and 120. On the other hand, if the fourth page data is logic '0', the respective memory cells may be programmed to the respective upper threshold voltage distributions 110 and 130.

In the distribution diagram, settings of second verify voltages Vfy2 and Vfy3 may define the adjacent threshold voltage distributions. In some embodiments, the second verify voltage Vfy2 may be set to the maximum voltage of the threshold voltage distribution 100 and/or the second verify voltage Vfy3 may be set to the maximum voltage of the threshold voltage distribution 120. In such embodiments, e.g., there may be a reduction in a possibility that the threshold voltage may increase beyond the first verify voltage Vpre2 due to over-programming and/or a reduction in a possibility that the respective memory cells included in the threshold voltage distribution 120 may have a threshold voltage below the first verify voltage Vpre2 due to charge loss. Thus, in such embodiments, there may be, e.g., a remarkable decrease in a possibility that an error may occur due to the Program Inhibit resulting from a first verify read operation.

Figure 1:
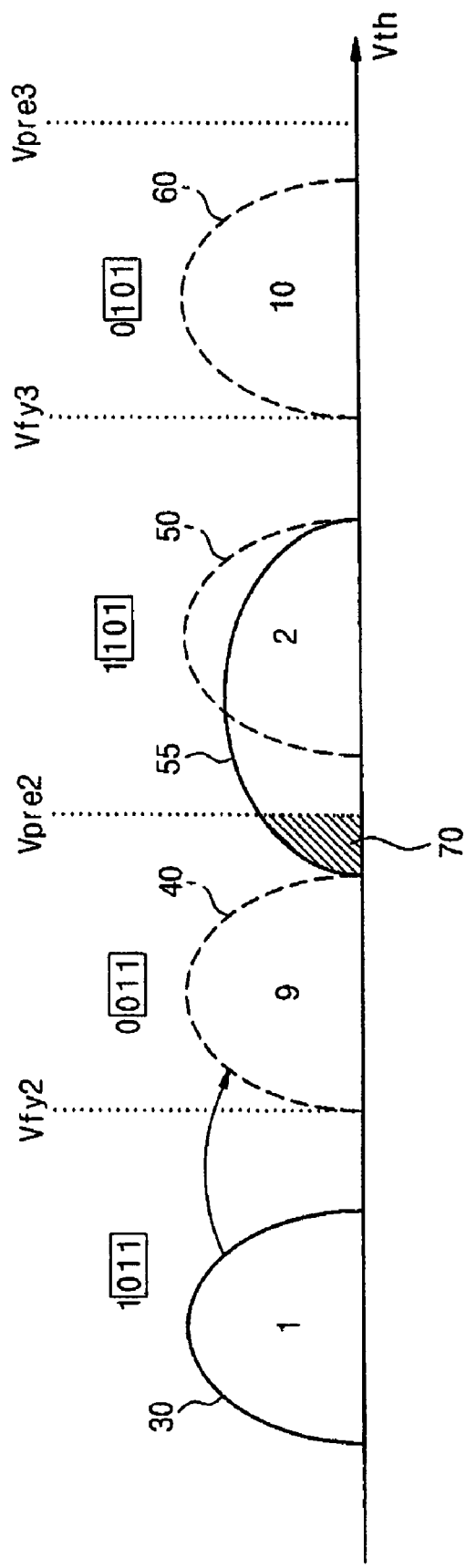
FIG. 1 illustrates a diagram of a problem of charge loss that may occur during a programming operation of a multi-bit memory cell.
Figure 2:
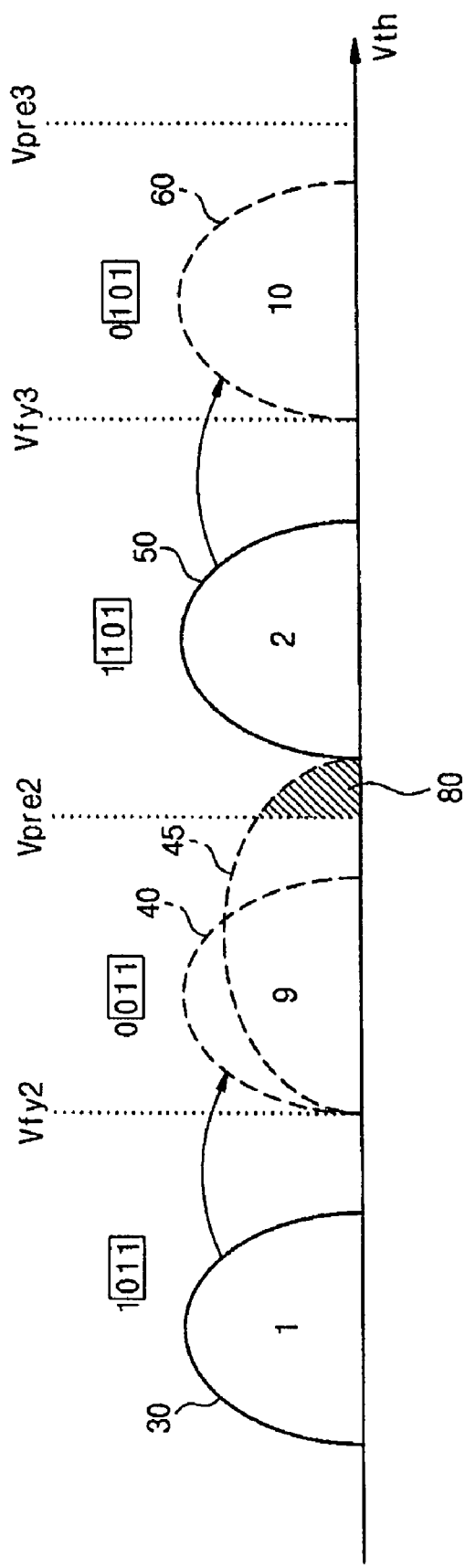
FIG. 2 illustrates a diagram of a problem of over-programming that may occur in a programming operation of a multi-bit memory cell.

According to the embodiment described with reference to FIG. 3, the threshold voltage distribution resulting from the programming of the fourth page data may be set to be adjacent to the pre-program threshold voltage distribution. Further, as may be seen therein, spacing between respective voltage distributions 100, 110 and voltage distributions 120, 130 may be less than that between adjacent voltage distributions 110, 120. In the immediately adjacent configuration of FIG. 3, spacing between respective voltage distributions 100, 110 and voltage distributions 120, 130 may be substantially zero. In contrast, the ideal voltage distributions in FIG. 1 are substantially evenly spaced. However, in accordance with an embodiment, as illustrated in FIG. 3, the first and second verify voltages may all be substantially evenly spaced. The second verify voltage(s) Vfy2, Vfy3 is/are not, however, limited to the maximum voltage of the respective threshold voltage distribution 100, 120.

Figure 4:
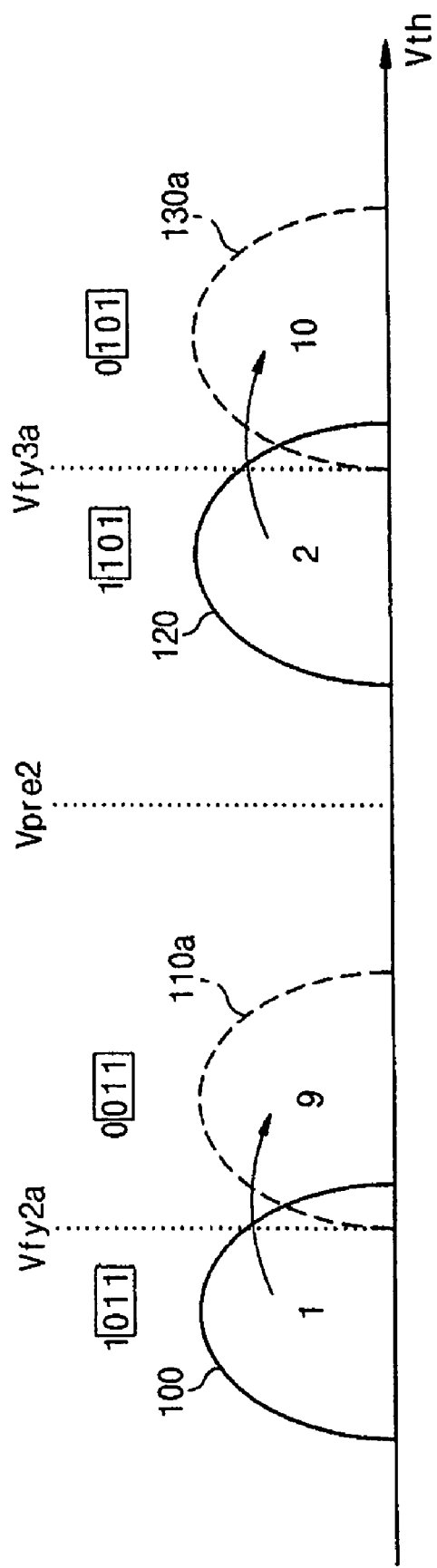
FIG. 4 illustrates a diagram of distributions of verify voltages and threshold voltages according to another exemplary embodiment of the present invention.

FIG. 4 illustrates a diagram of distributions of verify voltages and threshold voltages according to another exemplary embodiment of the present invention. In some embodiments, second verify voltages Vfy2a, Vfy3a may be set to a voltage included in the respective threshold voltage distribution 100, 120. That is, the second verify voltage Vfy2a may be set to a voltage included in, e.g., the threshold voltage distribution 100 and the second verify voltage Vfy3a may be set to a voltage included in, e.g., the threshold voltage distribution 120. In this case, the threshold voltage distribution 100, 120 overlap with respective threshold voltage distribution 110a, 130a. More particularly, e.g., in some embodiments, the second verify voltage Vfy2a, Vfy3a may be set to a voltage lower than the maximum voltage of the threshold voltage distribution 100, 120, provided that such settings may improve operational characteristics even in the event of a 1-bit error. Accordingly, in the exemplary embodiment illustrated in FIG. 4, the threshold voltage distribution resulting from the programming of the fourth page data may be set to overlap with the pre-program threshold voltage distribution.

Figure 5:
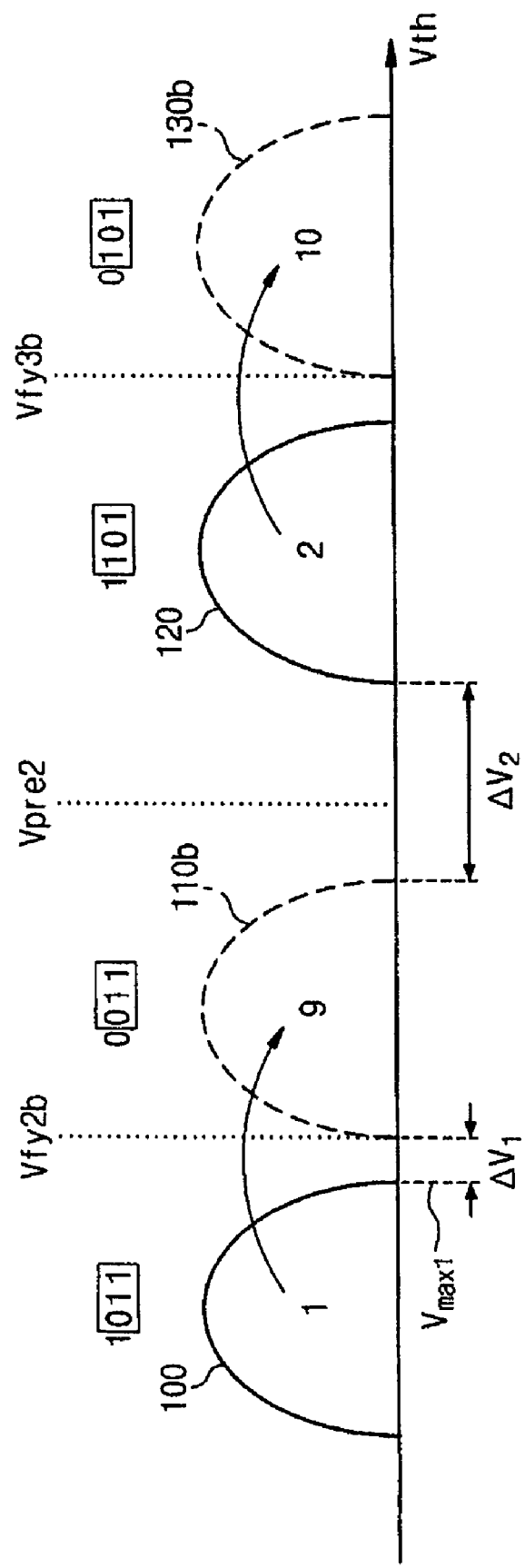
FIG. 5 illustrates a diagram of distributions of verify voltages and threshold voltages according to another exemplary embodiment of the present invention.

FIG. 5 illustrates a diagram of distributions of verify voltages and threshold voltages according to another exemplary embodiment of the present invention. For example, in some embodiments, second verify voltage Vfy2b, Vfy3b may be set to a voltage higher than a maximum voltage Vmax1 of the threshold voltage distribution 100, 120. In such cases, the second verify voltages Vfy2b and Vfy3b may be set such that an interval $\Delta V_1$ between the threshold voltage distributions 100 and 110b is smaller than an interval $\Delta V_2$ between the threshold voltage distributions 110b and 120. Accordingly, in the exemplary embodiment illustrated in FIG. 5, the verify voltages Vfy2b and Vfy3b may be set such that the post-program threshold voltage distribution resulting from the programming of the fourth page data may be spaced apart by a predetermined interval $\Delta V_1$ from the pre-program threshold voltage distribution. In such cases, the interval $\Delta V_1$ between the threshold voltage distributions 100 and 110 will have to be different from an interval between the threshold voltage distributions 110 and 120. For example, the interval $\Delta V_1$ between the threshold voltage distributions 100 and 110 may be smaller than the interval $\Delta V_2$ between the threshold voltage distributions 110 and 120.

As described above, in embodiments, there may be a little or no read margin between the threshold voltage distributions resulting from the programming of, e.g., the fourth and third page data. Accordingly, an allowable program error may be at most 1 bit. In embodiments, settings of the threshold voltage distributions or the verify voltages may provide a large margin between, e.g., respective ones of the first and second verify voltages. Therefore, it may be possible to avoid problems of, e.g., having the memory cells being set to be Program Inhibit by the first verify operation (preliminary read). Embodiments may also reduce and/or prevent occurrence of a 2-bit programming error and/or movement of a threshold voltage into a state causing a large burden of error correction.

Figure 6:
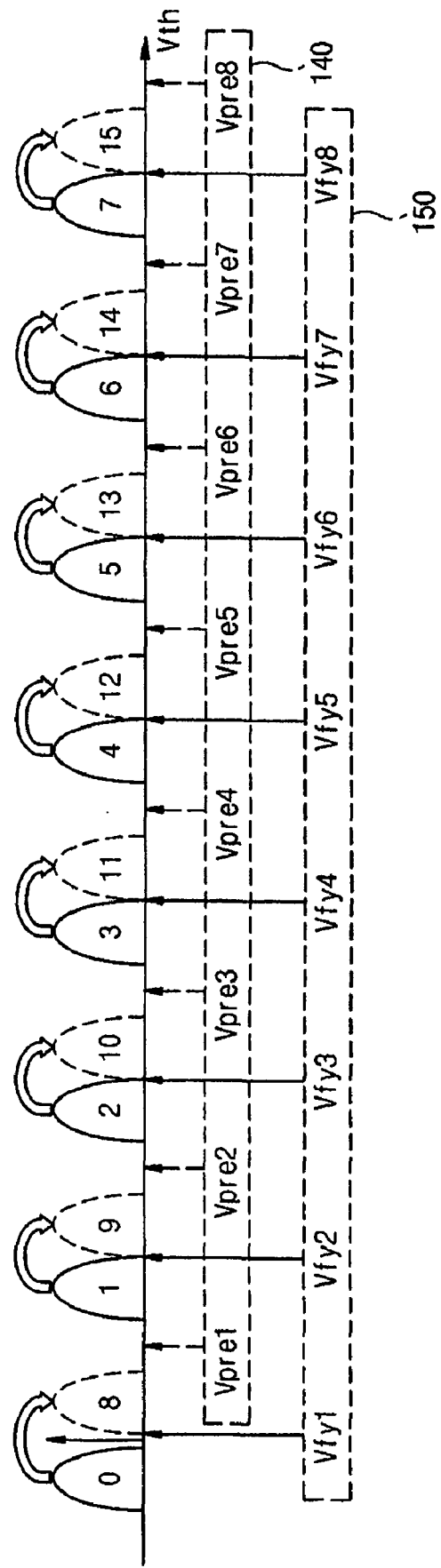
FIG. 6 illustrates a diagram of distributions of verify voltages and threshold voltages in a 4-bit flash memory device according to an embodiment of the present invention.

FIG. 6 illustrates a diagram of distributions of verify voltages and threshold voltages in a 4-bit flash memory device according to an embodiment of the present invention.

Referring to FIG. 6, the threshold voltage distributions resulting from programming of fourth page data may be set to be respectively adjacent to the threshold voltage distributions resulting from programming of the third page data.

Threshold voltage states 0 to 7 may be created by programming of third page data. Thereafter, threshold voltage states 8 to 15 may be created by programming of fourth page data. The threshold voltage states 8 to 15 may be created when the fourth page data is logic '0'. When the fourth page data is logic '1', the threshold voltage may not change because of Program Inhibit. Verify voltages for verifying the Program Pass/Fail of the fourth page data may be set to a voltage corresponding to a boundary between the pre-program threshold voltage distribution and the post-program threshold voltage distribution. That is, the second verify voltage Vfy2 for verifying success of a program to the threshold voltage corresponding to, e.g., state 9 may be set to a maximum voltage of the threshold voltage distribution corresponding to the state 1. That is, the respective second verify voltage may be set to a voltage corresponding to a boundary between the threshold voltage distribution corresponding to the state 1 and the threshold voltage distribution corresponding to the state 9. Likewise, the second verify voltage Vfy3/Vfy4/Vfy5/Vfy6/Vfy7/Vfy8 for verifying success of a program of the threshold voltages corresponding to the state 10/11/12/13/14/15 may be set to the maximum voltage of the threshold voltage distribution corresponding to the respective state 2/3/4/5/6/7. However, in some embodiments, the second verify voltage Vfy1 corresponding to state 8 programmed from erase state 0 may not be set to the maximum voltage of the threshold voltage distribution corresponding to the erase state 0. For example, in some embodiments, while other ones of the second verify voltages may be set to a maximum voltage of the respective threshold voltage distribution, the second verify voltage Vfy1 may be set to 0V or more.

The verify read operation may include, e.g., two read operations for each threshold voltage state. For the verify read operation for verifying whether a respective memory cell is programmed to the state 8, a first verify voltage Vpre1 may supplied to a word line of the memory cells to select memory cells corresponding to states 0 and 8. Thereafter, a second verify voltage Vfy1 may be supplied to a word line of the selected memory cells, and the memory cells programmed to a voltage higher than the second verify voltage Vfy1 may be set to be Program Inhibit. Through these operations, the memory cells that have a threshold voltage between the first verify voltage Vpre1 and the second verify voltage Vfy1 may be determined to be Program Pass and are then set to be Program Inhibit. However, the memory cells that do not have a threshold voltage between the first verify voltage Vpre1 and the second verify voltage Vfy1 are set to be reprogrammed. Once the verify read operation for state 8 is completed, a verify read operation for the state 9 may be performed by a first verify voltage Vpre1 and a second verify voltage Vfy2. After the verify read operations for the states 9 to 15 are sequentially performed, the memory cells determined to be Program Fail are reprogrammed by the subsequent program loop. The program operation and the verify operation are repeated until all the memory cells are determined to be Program Pass. The verify read operations may be respectively performed on the memory cells programmed to the states 8 to 15 by sequentially supplying the first verify voltages 10 (Vpre1~Vpre8) and the second verify voltages 20 (Vfy1~Vfy8) to a respective word line.

The second verify voltage Vfy1/ . . . /Vfy8 is not, however, limited to the maximum voltage of the state 0/ . . . /7. For example, the second verify voltage Vfy1/ . . . Vfy8 may be set to a voltage lower or higher than the maximum voltage of the state 0/ . . . /7. For example, in some embodiments, the second verify voltage Vfy2 may be set to a voltage greater than the respective maximum voltage of the state 1 and such that a voltage interval between the state 1 and the state 9 is different from a voltage interval between the state 9 and the state 2. That is, e.g., for a large read margin for the first verify operation, the second verify voltage Vfy2 may be set such that the voltage interval between the state 1 and the state 9 is smaller than the voltage interval between the state 9 and the state 2. In some other embodiments, as described above, the second verify voltages Vfy1 to Vfy8 may be set such that the pre-program state overlaps with the post-program state.

Although the threshold voltage distributions and the verify voltages for programming the most significant bit (MSB) page data of the 4-bit flash memory device have been employed to describe aspects of the invention, embodiments of the present invention are not limited to this. That is, aspects of the present invention may also be applied to the programming of the non-MSB page data. Although FIG. 3 illustrates that the bits of the multi-bit data may be input on a page basis, embodiments of the present invention are not limited to this. It will be apparent to those skilled in the art that the bits of the multi-bit data may be input, e.g., on a Y-address basis as well as on a page-address basis.

Although the 4-bit flash memory device has been specifically exemplified, the present invention is not limited to this. It will be apparent to those skilled in the art that the present invention can be applied to any multi-bit flash memory device that stores at least 2-bit data in one memory cell. That is, when a memory cell is programmed from one threshold voltage to another threshold voltage, the post-program threshold voltage distribution may be set to be adjacent to, to overlap with and/or to be spaced apart by a predetermined interval from the pre-program threshold voltage distribution. The maximum voltage of the pre-program threshold voltage distribution is used as a verify voltage for verifying the Program Pass/Fail. That is, the verify voltage for verifying the Program Pass/Fail is set to a voltage corresponding to the boundary between the above-described two threshold voltage distributions.

Figure 7:
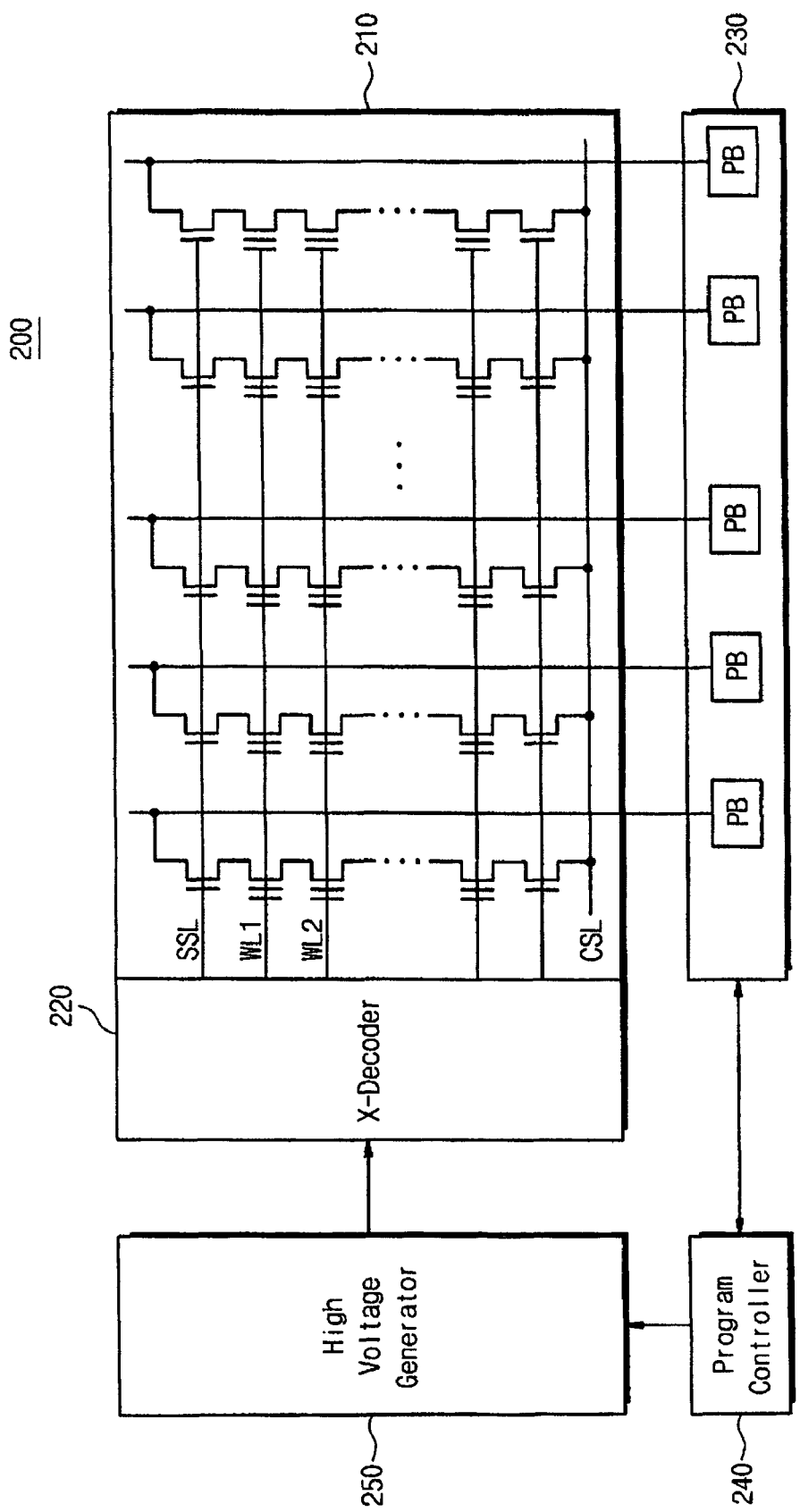
FIG. 7 illustrates a block diagram of a multi-bit flash memory device according to an embodiment of the present invention.

FIG. 7 illustrates a block diagram of a multi-bit flash memory device 200 according to an embodiment of the present invention, the verify voltages of which are set according to the above-described method.

Referring to FIG. 7, the multi-bit flash memory device 200 may include a cell array 210, a row (X) decoder 220, a page buffer (PB) block 230, a program controller 240, and a high voltage generator 250. The multi-bit flash memory device 200 may program multi-bit data according to the method described with reference to FIG. 6. For a program operation of the MSB page of the multi-bit data, the multi-bit flash memory device 200 may use the maximum voltage of the pre-program threshold voltage distribution as the verify voltage. As described above, the settings of the verify voltages are not limited to the MSB page of the multi-bit data.

The multi-bit flash memory device 200 may include a plurality of multi-bit flash memory cells that can store multi-bit data in one cell. In an exemplary embodiment, a cell array 210 may include memory cells storing 4-bit data. However, the scope of the present invention is not limited to this. In general, multi-bit flash memory cells may be programmed to one of a plurality of threshold voltage states in order to store a plurality of bits in one cell. Therefore, it is difficult to provide a sufficient read margin between threshold voltage states in a multi-bit flash memory device by using general program schemes and general circuit technologies. Thus, a multi-bit flash memory cell may need to be programmed densely in order to include $2^k$ threshold voltage states corresponding to k bits stored within the limited threshold voltage range. Also, an interval, i.e., a read margin, between threshold voltage states of the multi-bit flash memory cell may need to be reduced.

In general, the row decoder 220 may select a word line in response to a row address. The row decoder 220 may transfer various word line voltages, received from the high voltage generator 250, to selected word lines. In a programming operation, a program voltage Vpgm, e.g., from about 15 V to about 20 V, may be transferred to a selected word line (WL) and a pass voltage Vpass, e.g., about 10 V, may be transferred to an unselected word line.

Depending on an operating mode, the PB block 230 may serve as a write driver or a sense amplifier. For example, the PB block 230 may serve as a sensor amplifier in a read operation mode and may serve as a write driver in a program operation mode. In a program operation, the PB block 230 may perform a first preliminary read operation in which one of the first verify voltages Vpre1 to Vpre8 is provided to a selected word line. Thereafter, the PB block 230 may perform a second preliminary read operation in which one of the second verify voltages Vfy1 to Vfy8 is provided to a word line of cells on which the first read operation has been performed. The results of the first and second read operations may be latched in page buffers (PBs) of the PB block 230. The program controller 240 may determine the Program Pass/Fail of MSB page data on the basis of the results of the first and second read operations latched in the PBs. Memory cells, determined to be Program Pass, may be set to be Program Inhibit.

The program controller 240 may control the PB block 230 and the high voltage generator 250 in order to program sequentially-input program data in the cell array 210. In the program operation, the program controller 240 may determine the Program Pass/Fail of selected memory cells on the basis of data received from the PB block 230. Memory cells, determined to be Program Pass, may be set to be Program Inhibit. Memory cells, determined to be Program Fail, may be set to be reprogrammed by repetition of the program loop.

Under control of the program controller 240, the high voltage generator 250 may generate an incremental step pulse programming (ISPP) voltage, the first verify voltages Vpre1 to Vpre8, and the second verify voltages Vfy1 to Vfy8. In particular, the high voltage generator 250 may generate the second verify voltages Vfy1 to Vfy8 corresponding to the maximum voltage of the threshold voltage distribution resulting from the programming of the third page data. During a verify operation after a program loop, the high voltage generator 250 may sequentially generate the first verify voltages Vpre1 to Vpre8 and the second verify voltages Vfy1 to Vfy8 under the control of the program controller 240. The high voltage generator 250 may transfer the generated voltage to the row decoder 220. The row decoder 220 may provide the received voltages to the selected word lines. The high voltage generator 250 may generate a pass voltage Vpass to be supplied to the unselected word line in the program operation or the verify operation. Although the 4-bit flash memory device has been specifically exemplified, embodiments of the present invention is not limited to this. Although the preliminary verify read operation has been described using the program operation for the MSB page data or the fourth page data, it will be apparent to those skilled in the art that the preliminary verify read operation of the present invention is not limited this.

As described above, a multi-bit flash memory device according to the present invention uses the second verify voltages Vfy1 to Vfy8, which correspond to the maximum voltage of the threshold voltage distribution resulting from the programming of the third page data, during the program operation for the fourth page data. The settings of the second verify voltages Vfy1 to Vfy8 may reduce an error that may be generated during the verify operation using the first verify voltages. Although the NAND multi-bit flash memory device has been specifically exemplified, aspects the present invention can also be applied to, e.g., a NOR multi-bit flash memory device. Those of ordinary skill in the art will appreciate other features of multi-bit memory devices that store multi-bit data in one memory cell, such as those disclosed in U.S. Pat. No. 7,035,144 entitled 'FLASH MEMORY DEVICE HAVING MULTI-LEVEL CELL AND READING AND PROGRAMMING METHOD THEREOF', U.S. Pat. No. 7,082,056 entitled 'FLASH MEMORY DEVICE AND ARCHITECTURE WITH MULTI LEVEL CELLS', and U.S. Pat. No. 5,923,587 entitled 'MULTI-BIT MEMORY CELL ARRAY OF A NONVOLATILE SEMICONDUCTOR MEMORY DEVICE AND METHOD FOR DRIVING THE SAME', the contents of which are hereby incorporated by reference.

Figure 8:
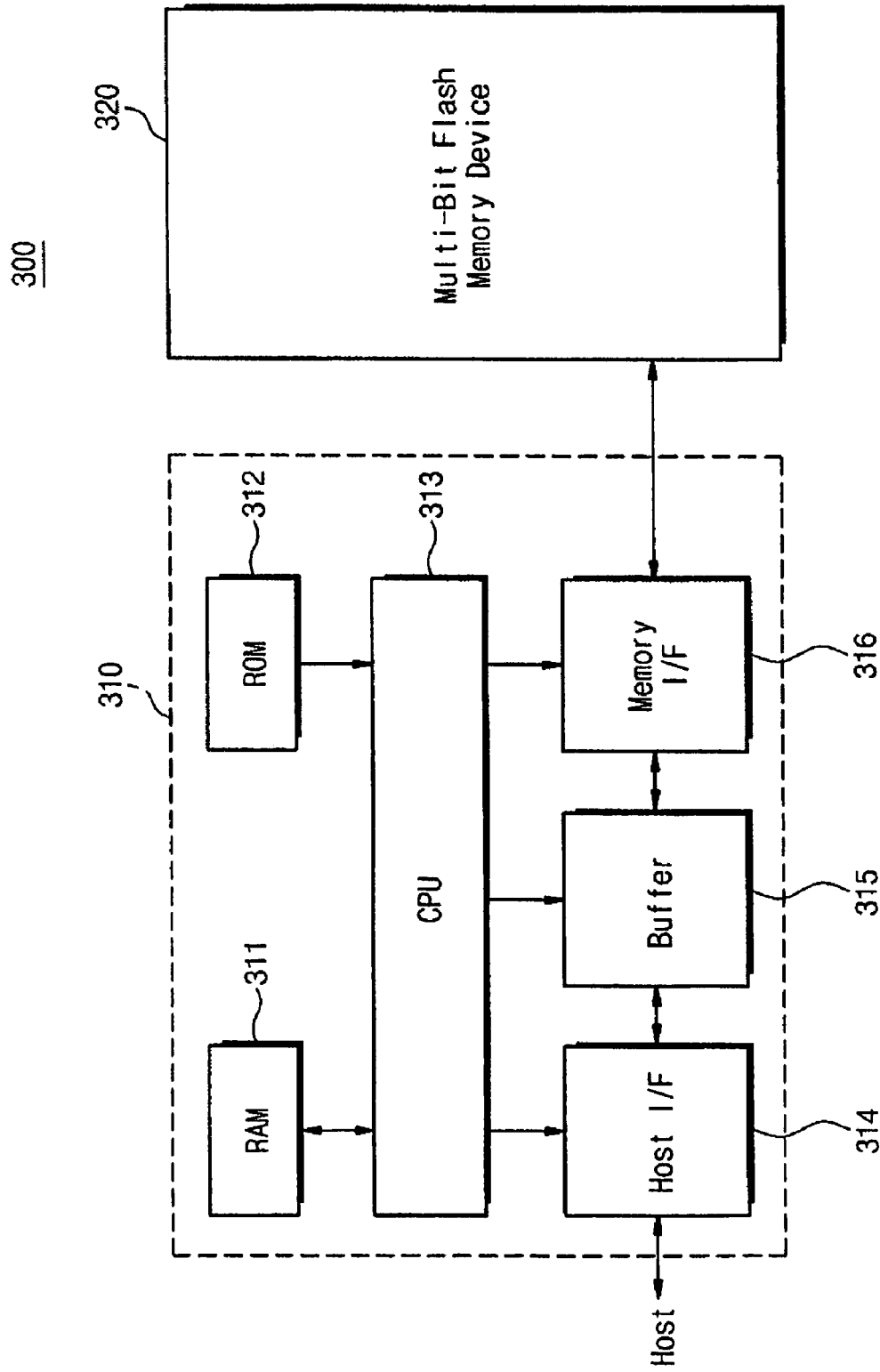
FIG. 8 illustrates a block diagram of a memory card with a multi-bit flash memory device according to an embodiment of the present invention.

FIG. 8 illustrates a block diagram of a memory card with a multi-bit flash memory device according to an embodiment of the present invention.

Referring to FIG. 8, for high-capacity data storage, a memory card 300 employing one or more aspects of the invention may include a memory controller 310 and a multi-bit flash memory device 320. The memory controller 310 may control data exchanges between a host and the multi-bit flash memory device 320. The memory controller 310 may include a random access memory (RAM) 311, a read only memory (ROM) 312, a central processing unit (CPU) 313, a host interface (I/F) 314, a buffer 315, and a memory interface (I/F) 316. The ROM 312 may store code data for interfacing with the host. The RAM 311 may be used as a working memory for the CPU 313. The host interface 314 may include a data exchange protocol of the host connected to the memory card 300. The buffer 315 may store data received from the host. The buffer 315 may store data transferred from the multi-bit flash memory device 320 to the host. The memory interface 316 may interface with the multi-bit flash memory device 320. The CPU 313 may perform control operations for data exchange of the memory controller 310. Although not illustrated in FIG. 8, the memory card 300 may further include an error correction code (ECC) block. The ECC block may correct an error (1-bit error or less) in read data of the multi-bit flash memory device 320.

In embodiments of the present invention as described above, an error in the verify operation for the program operation may be restricted to a maximum of 1-bit, thereby making it possible to implement a high-reliability multi-bit flash memory device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of programming a plurality of memory cells of a flash memory device by selectively changing a threshold voltage distribution thereof from a first distribution to a second distribution, the method comprising:
    selecting at least one of the memory cells to be programmed; and
    programming the at least one selected memory cell to a voltage higher than a verify voltage,
    wherein the verify voltage is one of threshold voltages included in the first distribution or is higher than the threshold voltages included in the first distribution,
    an interval between the first distribution and the second distribution is less than an interval between the second distribution and a third distribution defined during programming of a prior page data, and
    the first distribution corresponds to a first state and the third distribution corresponds to a second state directly following the first state during programming of the prior page data.

2. The method as claimed in claim 1, wherein the verify voltage is one of the threshold voltages included in the first distribution or a maximum voltage of the first distribution.

3. The method as claimed in claim 1, wherein:
    the verify voltage is a second verify voltage and a first voltage difference between the second verify voltage and a maximum voltage of the first distribution is less than a second voltage difference between a maximum voltage of the second distribution and a respective first verify voltage,
    the first verify voltage corresponds to a voltage between voltages of the first distribution and voltages of the third distribution defined during programming of the prior page data, and
    the first distribution corresponds to the first state and the third distribution corresponds to the second state directly following the first state during programming of the prior page data.

4. The method as claimed in claim 1, wherein at least 2 or more multi-bit data are stored in one memory cell of the flash memory device.

5. The method as claimed in claim 4, wherein the second distribution is created by programming of page data among the multi-bit data.

6. The method as claimed in claim 5, wherein the second distribution is created by programming of most significant bit (MSB) page data among the multi-bit data.

7. The method as claimed in claim 4, wherein the flash memory device further includes memory cells that are programmed from the third distribution to a fourth distribution higher than the third distribution during a period when the at least one memory cell is programmed to change the threshold voltage distribution thereof from the first distribution to the second distribution.

8. The method as claimed in claim 7, wherein an interval between the first distribution and the second distribution is different from an interval between the second distribution and the third distribution.

9. The method as claimed in claim 8, wherein the interval between the first distribution and the second distribution is smaller than the interval between the second distribution and the third distribution.

10. The method as claimed in claim 7, wherein the verify voltage is set such that the interval between the first distribution and the second distribution is different from the interval between the second distribution and the third distribution.

11. A method of programming a multi-bit flash memory device including a memory cell having a threshold voltage included in one of a plurality of voltage distribution states, the method comprising:
    programming the memory cell such that the threshold voltage thereof changes from an initial state; and
    verifying whether the threshold voltage has been programmed to a voltage higher than a verify voltage corresponding to a target state,
    wherein the verify voltage is one of threshold voltages included in the initial state or is higher than the threshold voltages included in the initial state,
    an interval between a first and a second one of the voltage distribution states is less than an interval between the second and a third one of the voltage distribution states, and the third voltage distribution is defined during programming of a prior page data, and
    the first voltage distribution corresponds to the initial state and the third voltage distribution corresponds to the target state directly following the initial state during programming of the prior page data.

12. The method as claimed in claim 11, wherein the voltage intervals between the voltage distribution states are set to be different from each other.

13. The method as claimed in claim 11, wherein the target state is a threshold voltage distribution that is created by programming of one bit of multi-bit data stored in the memory cell.

14. The method as claimed in claim 13, wherein the target state is created by programming a most significant bit (MSB) page data among the multi-bit data.

15. The method as claimed in claim 14, wherein the initial state is created by programming a least significant bit (LSB) page data among the multi-bit data.

16. The method as claimed in claim 12, wherein verifying whether the threshold voltage has been programmed to a voltage higher than a verify voltage corresponding to a target state comprises:
    performing a first verify operation for verifying whether the threshold voltage of the memory cell has been included in the initial state or the target state; and
    performing a second verify operation for verifying whether the threshold voltage has been programmed to a voltage higher than the verify voltage.

17. The method as claimed in claim 16, wherein performing a first verify operation includes providing a preliminary verify voltage to a word line of the memory cell.

18. The method as claimed in claim 17, wherein the preliminary verify voltage is higher than a maximum voltage of a threshold voltage distribution corresponding to the target state.

19. A flash memory device, comprising:
a plurality of memory cells having a threshold voltage corresponding to one of a plurality of states corresponding to multi-bit data;
a page buffer block coupled to bit lines of the memory cells and configured to perform a read/program operation;
a high voltage generator configured to provide a program voltage or a program verify voltage to a word line of selected memory cells; and
a program controller configured to control the high voltage generator or the page buffer block in order to verify whether the threshold voltage of the selected memory cells has been programmed from a first state to a second state among the plurality of states, during a program verify operation on one unit of the multi-bit data,
wherein the program verify voltage is one of threshold voltages included in the first state or is higher than the threshold voltages included in the first state,
an interval between a first voltage distribution state and a second one of the voltage distribution states is less than an interval between the second voltage distribution state and a third voltage distribution state, and the third voltage distribution is defined during programming of a prior page data, and
the first voltage distribution corresponds to the first state and the third voltage distribution corresponds to the second state directly following the first state during programming of the prior page data.

20. The flash memory device as claimed in claim 19, wherein the program controller controls the high voltage generator or the page buffer block such that some of the plurality of memory cells are programmed from the third distribution to a fourth distribution higher than the third distribution, during a period while the selected memory cells are programmed such that the threshold voltage changes from the first distribution to the second distribution.

21. The flash memory device as claimed in claim 20, wherein the program verify voltage is set such that the interval between the first distribution and the second distribution is different from the interval between the second distribution and the third distribution.

22. The flash memory device as claimed in claim 21, wherein the program verify voltage includes a first verify voltage and a second verify voltage for detecting whether the selected memory cells has been programmed to the second state.

23. The flash memory device as claimed in claim 19, wherein the multi-bit data has a size of 2 or more bits.

24. The flash memory device as claimed in claim 23, wherein the one unit is a page unit set in the flash memory device.

25. The flash memory device as claimed in claim 24, wherein the bits of the multi-bit data are designated by a page address and are programmed on a page basis.

26. The flash memory device as claimed in claim 23, wherein the one unit is the most significant bit (MSB) page data among the multi-bit data.

27. The flash memory device as claimed in claim 23, wherein the threshold voltage corresponding to the second state is a threshold voltage that is programmed when a most significant bit (MSB) page data is logic '0'.

28. The flash memory device as claimed in claim 23, wherein the one unit is a data unit that is programmed by a Y-address of the flash memory device.

29. The flash memory device as claimed in claim 19, wherein the plurality of memory cells are NAND-type flash memory cells.

30. The flash memory device as claimed in claim 19, wherein the plurality of memory cells are NOR-type flash memory cells.

* * * * *